(12) United States Patent
Lv et al.

(10) Patent No.: US 7,897,300 B2
(45) Date of Patent: Mar. 1, 2011

(54) GRAY SCALE MASK

(75) Inventors: Jing Lv, Beijing (CN); Seungjin Choi, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 301 days.

(21) Appl. No.: 12/128,725

(22) Filed: May 29, 2008

(65) Prior Publication Data

US 2009/0068572 A1 Mar. 12, 2009

(30) Foreign Application Priority Data

Sep. 10, 2007 (CN) .......................... 2007 1 0121555

(51) Int. Cl.
*G03F 1/00* (2006.01)
*H01L 21/00* (2006.01)
(52) U.S. Cl. ............................................ 430/5; 438/149
(58) Field of Classification Search ........................ 430/5
See application file for complete search history.

(56) References Cited

U.S. PATENT DOCUMENTS

| 6,255,130 | B1 * | 7/2001 | Kim ............................... 438/30 |
| 6,876,428 | B2 * | 4/2005 | Kwak et al. .................... 349/187 |
| 7,435,513 | B2 * | 10/2008 | Cote et al. ......................... 430/5 |
| 2008/0073718 | A1 * | 3/2008 | Lee et al. ..................... 257/347 |

FOREIGN PATENT DOCUMENTS

CN 101013705 A 8/2007

OTHER PUBLICATIONS

English Abstract of Chinese Application 101013705 A Published Aug. 8, 2007.

\* cited by examiner

*Primary Examiner* — Stephen Rosasco
*Assistant Examiner* — Jonathan Jelsma
(74) *Attorney, Agent, or Firm* — Ladas & Parry LLP

(57) ABSTRACT

A scale mask comprises a U-shaped source mask region, a drain mask region with an end extending into the source mask region, and a U-shaped light-blocking bar arranged between the source mask region and the drain mask region. Slits are formed between the source mask region and the light-blocking bar and between the light-blocking bar and the drain mask region, respectively, and first compensating regions are provided at inner sides of ends of the source mask region.

7 Claims, 5 Drawing Sheets

GRAY SCALE MASK

BACKGROUND OF THE INVENTION

The present invention relates to a gray scale mask, and particularly to a gray scale mask with slits and a light-blocking bar.

Currently, the manufacturing process of a thin film transistor liquid crystal display (TFT LCD) array substrate repeats thin film deposition, photolithography with a mask, and etching for several times. To reduce process period and save production time, a four mask (4Mask) technology has become introduced in manufacturing for replacing a conventional five (5Mask) technology. The implementation of the current 4Mask technology for mass production is to perform one masking process for both an active layer and a source/drain layer in patterning. After deposition of semiconductor layer and a source/drain layer, a gray scale mask (or gray tone mask) for example with slits and a light-blocking bar is used to perform a gray scale masking, so that the two masking processes for these two layers in the conventional 5Mask technology can be reduced to one masking process. The shape of the mask with slits and a light-blocking bar is for example shown in FIG. 8.

As shown in FIG. 8, the mask with slits and a light-blocking bar comprises a source mask region 1, a drain mask region 2, and light-blocking bar 4 arranged between the source mask region 1 and the drain mask region 2. In this structure, slits are formed between the source mask region 1 and the light-blocking bar 4 and between the drain mask region 2 and the light-blocking bar, respectively. As for the mask with slits and a light-blocking bar in the conventional technology, the photoresist in the gray scale region is not uniform in thickness, and the thickness of some photoresist in the gray scale region is so small that problems like the channel attack 7 in FIG. 9, the drain neck attack 8 in FIG. 10, and the like may occur. The channel attack 7 refers to a defect in which the portions between the ends of source mask region 1 and the drain mask region 2 depress. The drain neck attack 8 refers to a defect in which the neck of the drain mask region 2 depresses and the neck is narrowed. In either cases, the performance of the TFT changes or even deteriorates, which may influence the production quality.

SUMMARY OF THE INVENTION

According to a first aspect of the present invention, there is provided a gray scale mask, comprising a U-shaped source mask region, a drain mask region with an end extending into the source mask region, and a U-shaped light-blocking bar arranged between the source mask region and the drain mask region, wherein slits are formed between the source mask region and the light-blocking bar and between the light-blocking bar and the drain mask region, respectively, and first compensating regions are provided at inner sides of the ends of the source mask region.

According to a second aspect of the present invention, there is provided a compensating gray scale mask, comprising a U-shaped source mask region, a drain mask region with an end extending into the source mask region, and a U-shaped light-blocking bar arranged between the source mask region and the drain mask region, wherein slits are formed between the source mask region and the light-blocking bar and between the light-blocking bar and the drain mask region, respectively, and second compensating regions are provided at ends of the light-blocking bar.

Further scope of applicability of the present invention will become apparent from the detailed description given hereinafter. However, it is understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWING

The present invention will become more fully understood from the detailed description given hereinafter and the accompanying drawings which are given by way of illustration only, and thus are not limitative of the present invention and wherein.

DESCRIPTION OF THE PREFERRED EMBODIMENTS

Figure 1:
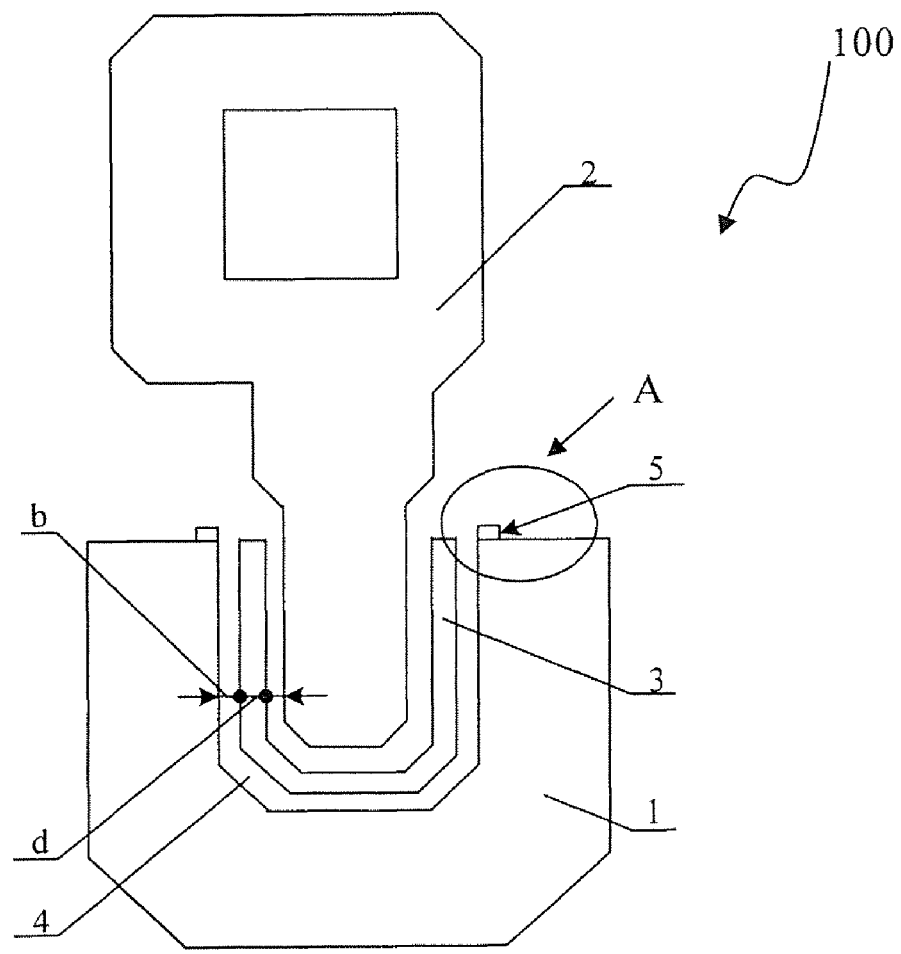
FIG. 1 is a structural diagram showing a compensating gray scale mask according to a first embodiment of the present invention.
Figure 2:
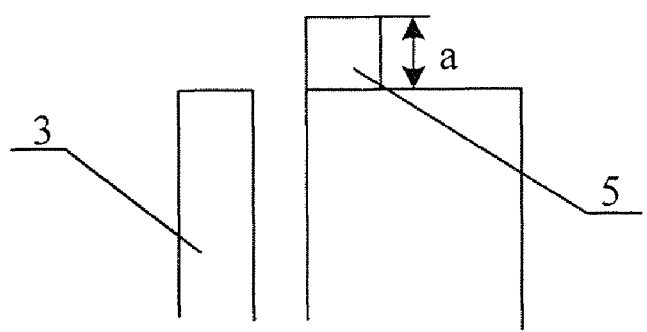
FIG. 2 is a schematic diagram illustrating region A in FIG. 1.

FIG. 1 is a structural diagram showing a compensating gray scale mask according to a first embodiment of the present invention. FIG. 2 is a schematic diagram illustrating region "A" in FIG. 1.

As shown in FIGS. 1 and 2, the compensating gray scale mask 100 comprises a source mask region 1, a drain mask region 2, and a light-blocking bar 3. The source mask region 1 is in a U shape, and an end of the drain mask region 2 is rectangular and extends into the U shape portion of the source mask region 1. The light-blocking bar 3 is arranged between the source mask region 1 and the drain mask region 2, and the light-blocking bar 3 is also in a U shape extending along the inner side of the source mask region 1. Slits 4 are formed between the source mask region 1 and the light-blocking bar 3 and between the light-blocking bar 3 and the drain mask region 2, respectively. First compensating regions 5 are provided at inner sides of the ends of the source mask region 1 (the sides near the drain mask region 2), to compensate a potential defect of channel attack.

In fabrication of a TFT, to form source and drain electrodes and a channel region, a semiconductor layer, an ohmic contact layer, and a source/drain metal layer are sequentially deposited on a substrate, and a layer of photoresist is coated on the resulting structure. The photoresist is exposed and developed with the gray scale mask 100 to form a photoresist pattern with difference in height on the surface of the photoresist. The height of the photoresist in a channel region is a fraction of that in a source region and a drain region, e.g., lower than the height of the photoresist in the source region and the drain region which is not been exposed. By using the resulting photoresist pattern as an etching mask, the source/drain metal layer, the ohmic contact layer, and the semiconductor layer are etched for the first time, and then an ashing is performed on the photoresist pattern to remove the photoresist corresponding to the channel region and retain that corresponding to the source and drain regions. The source/drain metal layer and the ohmic contact layer in the channel region are etched for the second time, so as to form the desired source and drain electrodes and the channel region in the active layer.

In the embodiment shown in FIGS. 1 and 2, the first compensating regions 5 can not only be in rectangular shape, but also be in other shapes, such as a dot shape or a mesh shape. When the first compensating regions 5 are in a rectangle shape, the height a of the rectangle is about 1.0 μm~about 2.0 μm. A preferred value of the height a can be selected and modified on basis of the feedbacks from practice, so as to ensure that the thickness of photoresist in the first compensating regions 5 is consistent with that in the channel region after exposure and developing of photoresist. In addition to the compensating effect of the first compensating regions 5, deterioration of performance of the TFT to be formed due to increase of the photoresist thickness in the first compensating regions 5 can be prevented.

With respect to deterioration of performance of the TFT due to the channel attack in the conventional mask, according to the first embodiment, there is provided a compensating gray scale mask, which can efficiently overcome such a defect by arranging compensating regions in connection with the source mask region. In particular, the first compensating regions are arranged at the ends of the source mask region to efficiently compensate the channel attack. This embodiment is simple in structure, easy to implement, and does not increase the production cost. Also, this embodiment can efficiently improve the performance of a TFT compared with the conventional technology and prevent the deterioration of performance.

In the channel pattern formed by the mask according to the first embodiment, after exposure and developing of photoresist, the thickness of the photoresist in the regions corresponding to the first compensating regions 5 is consistent with that of the photoresist in the channel region and distributed uniformly. Therefore, in the case an etching is performed with the resulting photoresist pattern as an etching mask, the defect of channel attack can be avoided, and the transition between the source mask region 1 and the drain mask region 2 may become smooth. In addition, only one first compensating region can be formed.

Figure 3:
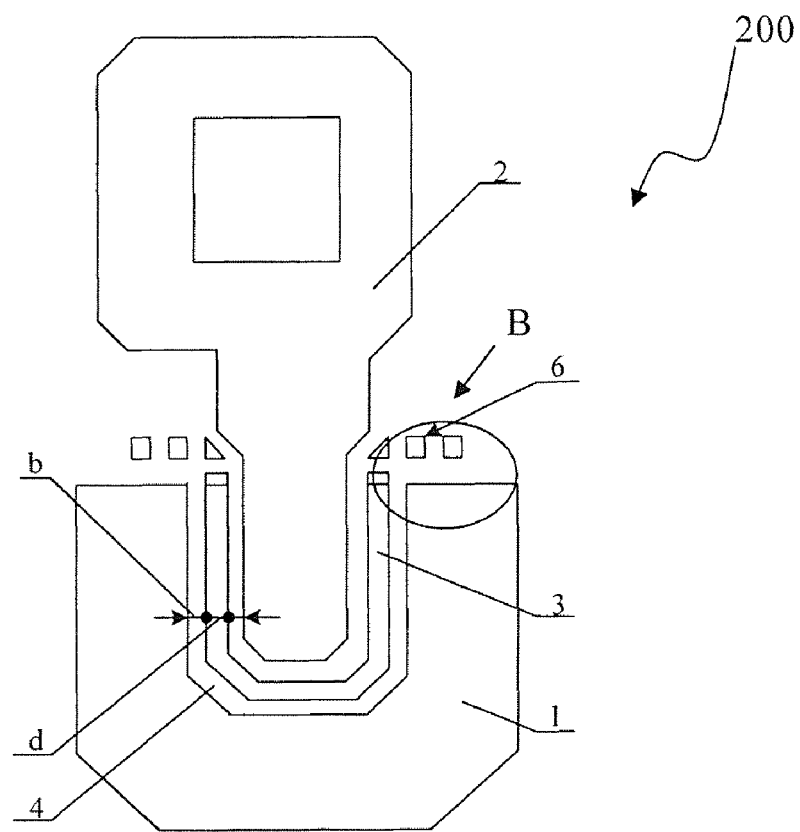
FIG. 3 is a structural diagram showing a compensating gray scale mask according to a second embodiment of the present invention.
Figure 4:
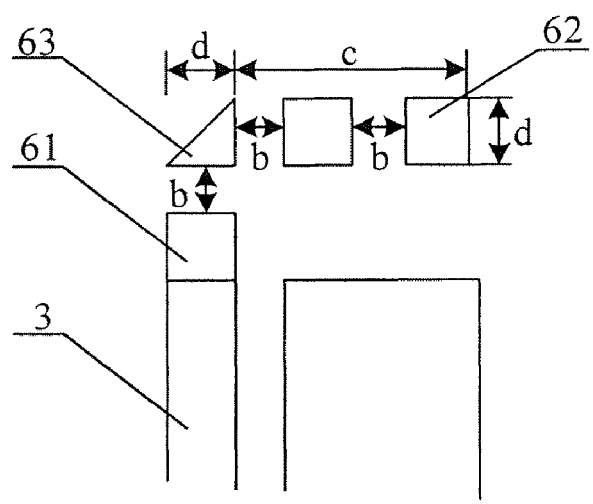
FIG. 4 is a schematic diagram illustrating region B in FIG. 3.

FIG. 3 is a structural diagram showing a compensating gray scale mask according to a second embodiment of the present invention. FIG. 4 is a schematic diagram illustrating region "B" in FIG. 3.

As shown in FIGS. 3 and 4, the compensating gray scale mask 200 comprises a source mask region 1, a drain mask region 2, and light-blocking bar 3. The source mask region 1 is in a U shape, and an end of the drain mask region 2 is rectangular and extends into the U shape portion of the source mask region 1. The light-blocking bar 3 is arranged between the source mask region 1 and the drain mask region 2, and the light-blocking bar 3 is also in a U shape. Slits 4 are formed between the source mask region 1 and the light-blocking bar 3 and between the light-blocking bar 3 and the drain mask region 2, respectively. Second compensating regions 6 are provided at ends of the light-blocking bar 3 for compensating defects of drain neck attack and channel attack.

With respect to deterioration of performance of a TFT due to the channel attack and drain neck attack in the conventional technology, according to the second embodiment of the invention, there is provided a compensating gray scale mask, which can efficiently overcome such defects by arranging compensating regions in connection with the light-blocking bar. In particular, the second compensating regions are arranged at ends of the light-blocking bar to efficiently compensate the channel attack and drain neck attack. This embodiment is simple in structure, easy to implement, and does not increase the production cost. Also, this embodiment can efficiently improve the performance of a TFT and prevent deterioration of performance.

In the second embodiment shown in FIGS. 3 and 4, the second compensating region 6 comprises a vertical straight bar 61, a horizontal straight bar 62, and a transition bar 63, which are arranged sequentially. These bars form a shape which extends upward from the ends of the light-blocking bar and then turn to extend outward away from the drain mask region 2. In particular, the vertical straight bar 61 is connected with the end of the light-blocking bar 3, and the horizontal straight bar 62 is perpendicular to the vertical straight bar 61. The transition bar 63 is arranged between the vertical straight bar 61 and the horizontal straight bar 62, and has two sides perpendicular to each other. As for the two sides of the transition bar 63, one of them is adjacent with the vertical straight bar 61, and the other is adjacent with the horizontal straight bar 62. The interval between the transition bar 63 and the vertical straight bar 61 may be the width b of the slits 4, and the interval between the transition bar 63 and the horizontal straight bar 62 may be also the width b of the slits 4.

In the second embodiment described above, the vertical straight bar 61 can not only be rectangular, but also be in other shapes, such as a dot shape or a mesh shape. When the vertical straight bar 61 is a rectangle, it for example has a width equal to the width d of the light-blocking bar 3, and a height a of about 1.0 μm~about 2.0 μm. When the vertical straight bar 61 comprises a plurality of rectangles spaced apart from each other, it has a width equal to the width d of the light-blocking bar 3, and the interval between adjacent rectangles equals to the width b of the slits 4s. In the present embodiment as shown, the vertical straight bar 61 comprises one rectangle.

In the second embodiment described above, the width c of the horizontal straight bar 62 is about 1.0 μm~about 4.0 μm. A preferred value of the width c can be selected and modified on basis of the feedbacks from practice. The height d of the horizontal straight bar 62 equals to the width of the light-blocking bar 3, to ensure that the thickness of photoresist in the second compensating regions 6 is consistent with that in the channel region after exposure and developing of photoresist. The horizontal straight bar 62 can not only be rectangular, but also be in other shapes, such as a dot shape or a mesh shape. The horizontal straight bar 62 may also comprise a plurality of rectangles spaced apart from each other. In the present embodiment, the horizontal straight bar 62 comprises two rectangles, and the two rectangles are separated from each other by an interval of the width b of the slits 4.

In the second embodiment described above, the transition bar 63 can be an isosceles right triangle, an isosceles right trapezoid, or an arc. In the present embodiment, description is made by taking an isosceles right triangle as an example. A right-angle side of the triangle is parallel with a side of the vertical straight bar 61 and has an interval equal to the width b of the slits 4. The other right-angle side of the triangle is parallel with a side of the horizontal straight bar 62 and has an interval equal to the width b of the slits 4.

In the channel pattern formed by the mask according to the second embodiment, after exposure and developing of photoresist, the thickness of the photoresist in the regions corresponding to the second compensating regions 6 is consistent with that of the photoresist in the channel region and distributed uniformly. Therefore, in the case an etching is performed with the resulting photoresist pattern as an etching mask, the defect of channel attack and drain neck attack can be avoided, and the ends 10 of the drain region thus formed are smooth.

Figure 5:
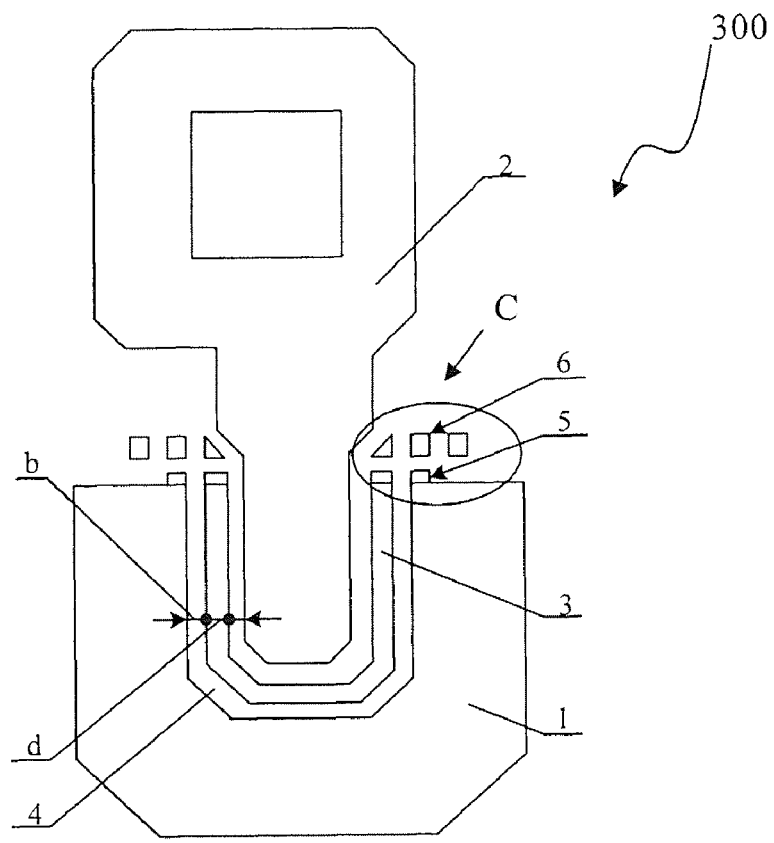
FIG. 5 is a structural diagram showing a compensating gray scale mask according to a third embodiment of the present invention.
Figure 6:
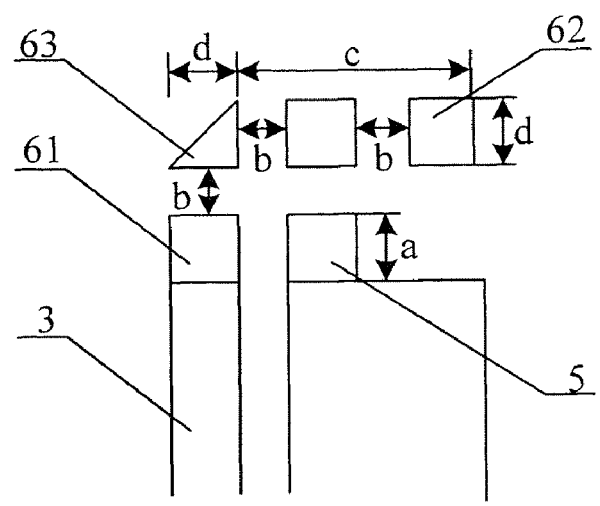
FIG. 6 is a schematic diagram illustrating region C in FIG. 5.

FIG. 5 is a structural diagram showing a compensating gray scale mask according to a third embodiment of the present invention. FIG. 6 is a schematic diagram illustrating region C in FIG. 5.

As shown in FIGS. 5 and 6, the compensating gray scale mask 300 comprises a source mask region 1, a drain mask region 2, and light-blocking bar 3. The source mask region 1 is in a U shape, and an end of the drain mask region 2 is rectangular and extends into the U shape portion of the source mask region 1. The light-blocking bar 3 is arranged between the source mask region 1 and the drain mask region 2, and the light-blocking bar 3 are also in a U shape. Slits 4 are formed between the source mask region I and the light-blocking bar 3 and between the light-blocking bar 3 and the drain mask region 2, respectively. First compensating regions 5 are provided at inner sides of the ends of the source mask region 1 for compensating the defect of channel attack, and second compensating regions 6 are provided at ends of the light-blocking bar 3 for compensating the defects of drain neck attack and channel attack.

With respect to deterioration of performance of a TFT due to the channel attack and drain neck attack in the conventional technology, according to the third embodiment, there is provided a compensating gray scale mask, which can efficiently overcome such defects by arranging compensating regions on the ends of the source mask region and the light-blocking bar. In particular, the first compensating regions are arranged at ends of the source mask region to efficiently compensate the channel attack, and the second compensating regions are arranged at ends of the light-blocking bar to efficiently compensate the channel attack and drain neck attack. This embodiment is simple in structure, easy to implement, and does not increase the production cost. Besides, this embodiment can efficiently improve the performance of a TFT and prevent the deterioration of performance.

In the third embodiment shown in FIGS. 5 and 6, the first compensating regions 5 have the same structure as that for the first compensating regions 5 in the first embodiment, and the second compensating regions 6 have the same structure as that for the second compensating regions 6 in the second embodiment.

Figure 7:
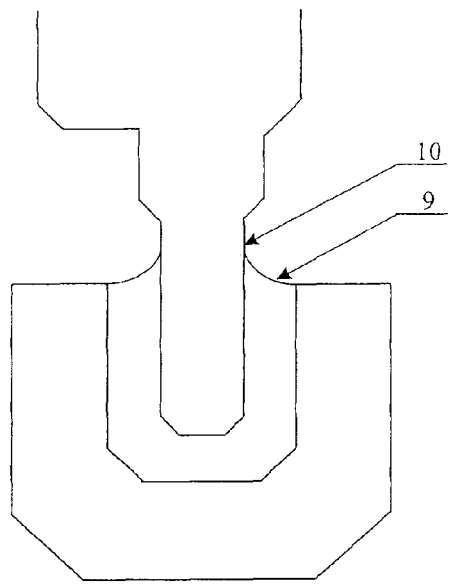
FIG. 7 is a schematic diagram showing a channel pattern formed with the mask in FIG. 5.
Figure 8:
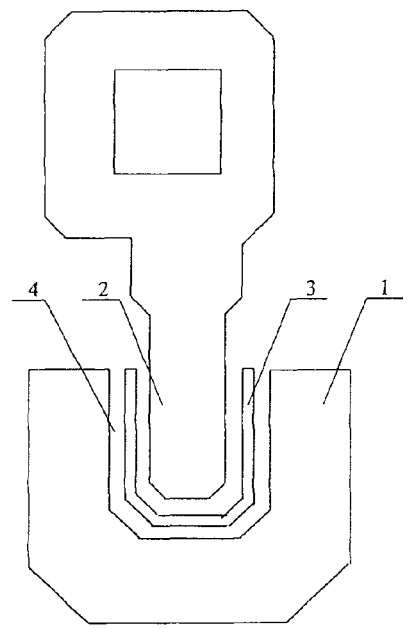
FIG. 8 is a diagram illustrating a gray scale mask in a conventional technology.
Figure 9:
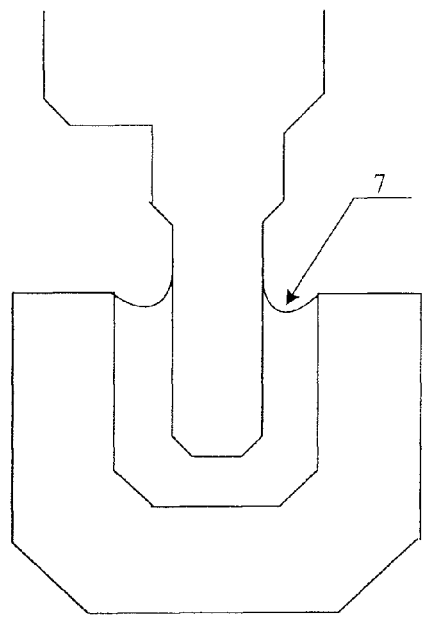
FIG. 9 is a schematic diagram showing a channel attack occurring in the gray scale mask of the conventional technology.
Figure 10:
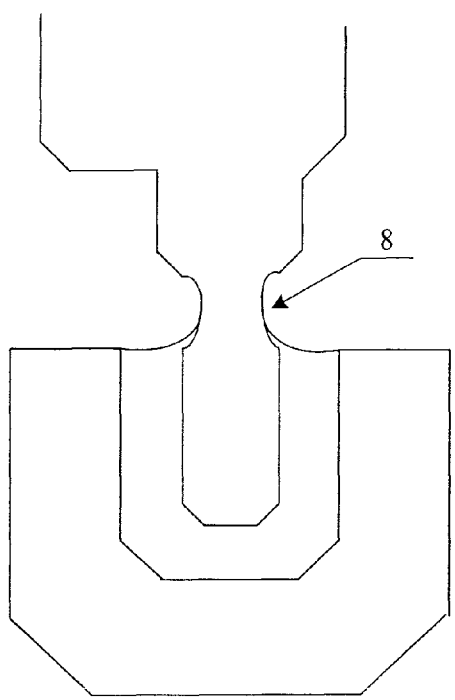
FIG. 10 is a schematic diagram showing a drain neck attack occurring in the gray scale mask of conventional technology.

FIG. 7 is a schematic diagram showing a channel pattern formed with the mask in FIG. 5. As shown in FIG. 7, as compared with the conventional mask pattern as shown in FIGS. 9 and 10, after exposure and developing of photoresist, the thickness of the photoresist in the regions corresponding to the first compensating regions 5 is consistent with that of the photoresist in the channel region and distributed uniformly. Therefore, in the case an etching is performed with the resulting photoresist pattern as an etching mask, the channel attack 7, i.e., a defect in which the portions between the ends of source mask region 1 and the drain mask region 2 depress, can be efficiently suppressed.

The transition 9 between the source mask region 1 and the drain mask region 2 is smooth in the resulting channel pattern. Similarly, with the mask pattern of the third embodiment, the thickness of the photoresist in the regions corresponding to the first compensating regions 5 and the second compensating regions 6 is consistent with that of the photoresist in the channel region and distributed uniformly. Therefore, after etching, the drain neck attack 8, i.e., a defect in which the neck of the drain mask region 2 depresses and the neck is narrowed, can also be efficiently suppressed. The ends 10 of the drain region thus formed are smooth. It has been demonstrated by practice that, the channel attack and the drain neck attack can be avoided effectively with the compensating gray scale mask in implementation of the present invention, and after etching with the mask, the improvement in the performance of TFT is remarkable.

It is appreciated that the embodiments described above are intended to illustrate but not limit the present invention. Although the present invention has been described in detail herein with reference to the preferred embodiments, it is understood by those skilled in the art that the present invention can be modified and some of the technical features can be equivalently substituted without departing from the spirit and scope of the present invention.

What is claimed is:

1. The gray scale mask for manufacturing a thin film transistor, comprising:
    a U-shaped source mask region,
    a drain mask region with an end extending into the source mask region, and
    a U-shaped light-blocking bar arranged between the source mask region and the drain mask region with slits being formed between the source mask region and the light-blocking bar and between the light-blocking bar and the drain mask region, respectively,
    wherein second compensating regions are provided at ends of the light-blocking bar; and
    wherein the second compensating regions comprise:
        a vertical straight bar connected with ends of the light-blocking bar;
        a horizontal straight bar perpendicular to the vertical straight bar; and
        a transition bar arranged between the vertical straight bar and the horizontal straight bar.

2. The gray scale mask according to claim 1, wherein the interval between the transition bar and the vertical straight bar is a width of the slits, and the interval between the transition bar and the horizontal straight bar is a width of the slits.

3. The gray scale mask according to claim 1, wherein a width of the horizontal straight bar is in a range of about 1.0 μm~about 4.0 μm.

4. The gray scale mask according to claim 1, wherein the horizontal straight bar is a rectangle with a height equal to a width of the light-blocking bar.

5. The gray scale mask according to claim 1, wherein the horizontal straight bar comprises a plurality of rectangles spaced apart from each other, and each of the rectangles has a height equal to a width of the light-blocking bar.

6. The gray scale mask according to claim 1, wherein first compensating regions are further provided at inner sides of ends of the source mask region, and the vertical straight bar is a rectangle which has a width equal to that of the light-blocking bar and a height equal to that of the first compensating regions.

7. The gray scale mask according to claim 1, wherein the vertical straight bar comprises a plurality of rectangles arranged sequentially, an interval between adjacent rectangles equals to the width of the slit, and each of the rectangles has a width equal to that of the light-blocking bar.

* * * * *